(12) United States Patent
Chen

(10) Patent No.: US 8,649,216 B2
(45) Date of Patent: Feb. 11, 2014

(54) DATA WRITING METHOD AND DATA STORAGE DEVICE FOR ADJUSTING PROGRAMMING VOLTAGE VALUES

(75) Inventor: Chun-Yi Chen, Chiayi (TW)

(73) Assignee: Silicon Motion, Inc., Jhubei, Hsinchu County (TW)

( * ) Notice: Subject to any disclaimer, the term of this patent is extended or adjusted under 35 U.S.C. 154(b) by 231 days.

(21) Appl. No.: 13/191,745

(22) Filed: Jul. 27, 2011

(65) Prior Publication Data

US 2012/0033492 A1 Feb. 9, 2012

(30) Foreign Application Priority Data

Aug. 4, 2010 (TW) .................................. 99125871 A

(51) Int. Cl.
*G11C 11/34* (2006.01)
*G11C 16/04* (2006.01)
(52) U.S. Cl.
USPC ................................. 365/185.03; 365/185.02
(58) Field of Classification Search
USPC ...... 365/185.03 O, 185.02 X, 185.03, 185.02
See application file for complete search history.

(56) References Cited

U.S. PATENT DOCUMENTS

| 7,426,139 B2 * | 9/2008 | Ho et al. .................. 365/185.03 |
| 8,345,477 B1 * | 1/2013 | Yang ........................ 365/185.03 |
| 2011/0044113 A1 * | 2/2011 | Kim et al. ................ 365/185.19 |

* cited by examiner

*Primary Examiner* — Vanthu Nguyen
(74) *Attorney, Agent, or Firm* — McClure, Qualey & Rodack, LLP

(57) ABSTRACT

The invention provides a data writing method. In one embodiment, a data storage device comprises a flash memory. First, the flash memory is directed to read a plurality of programming voltage values for data programming. The programming voltage values are then adjusted to obtain a plurality of adjusted programming voltage values according to difference bits between a plurality of stored data patterns corresponding to the programming voltage values. The adjusted programming voltage values are then sent to the flash memory. The flash memory is then directed to perform data programming according to the adjusted programming voltage values, wherein the data programmed according to the adjusted programming voltage values has a lower error bit rate than that of the data programmed according to the programming voltage values.

14 Claims, 11 Drawing Sheets

| Stored data pattern | 111 | 011 | 001 | 101 | 100 | 000 | 010 | 110 |
|---|---|---|---|---|---|---|---|---|
| Difference bit between stored data patterns of a neighboring data pair | MSB | | CSB | MSB | LSB | MSB | CSB | MSB |
| Programming voltage value | -1 | 0.7 | 1.5 | 2.3 | 2.9 | 3.7 | 4.4 | 5.2 |
| Adjusted programming voltage value | -1 | 0.7 | 1.2 | 2.3 | 2.7 | 3.7 | 4.1 | 5.2 |

FIG. 6

DATA WRITING METHOD AND DATA STORAGE DEVICE FOR ADJUSTING PROGRAMMING VOLTAGE VALUES

CROSS-REFERENCE TO RELATED APPLICATIONS

This application claims priority of Taiwan Patent Application No. 099125871, filed on Aug. 4, 2010, the entirety of which is incorporated by reference herein.

BACKGROUND OF THE INVENTION

1. Field of the Invention

The invention relates to flash memories, and more particularly to data writing of flash memories.

2. Description of the Related Art

Flash memories are divided into single level cell (SLC) flash memories, multi level cell (MLC) flash memories, and triple level cell (TLC) flash memories. A memory cell of an SLC flash memory stores a single data bit. A single memory cell of an SLC flash memory is therefore capable of storing a data pattern of a single bit with a value equal to either 0 or 1. A memory cell of an MLC flash memory stores two data bits. A single memory cell of an MLC flash memory is therefore capable of storing data selected from four data patterns with bit values 00, 01, 10, and 11. A memory cell of a TLC flash memory stores three data bits. A single memory cell of a TLC flash memory is therefore capable of storing data selected from eight data patterns with bit values 000, 001, 010, 011, 100, 101, 110, and 111.

A voltage used to write data to a memory cell of a flash memory is referred to as a programming voltage. Different programming voltage values correspond to different data patterns written to a memory cell. For example, a programming voltage for programming memory cells of an SLC flash memory has two different programming voltage values, a programming voltage for programming memory cells of an MLC flash memory has four different programming voltage values, and a programming voltage for programming memory cells of a TLC flash memory has eight different programming voltage values. When a controller wants to write a data pattern to a memory cell of a flash memory, the flash memory sets the voltage level of the memory cell to be equal to the programming voltage values corresponding to the data pattern. When the controller requires the flash memory to read data from the memory cell, the flash memory measures the voltage level of the memory cell, and then compares the voltage level with the programming voltage values to determine which data pattern is stored in the memory cell.

Referring to FIG. 1, a schematic diagram of data programming of a memory cell of a TLC flash memory is shown. A single memory cell of the TLC flash memory stores three data bits including a least significant bit (LSB), a center significant bit (CSB), and an most significant bit (MSB). The flash memory sequentially writes the LSB, the CSB, and the MSB to a memory cell. First, when the LSB is written to the memory cell, the flash memory adjusts the programming voltage of the memory cell to the level 121 or the level 122 shown in FIG. 1 according to whether the value of the LSB is the bit 0 or bit 1. When the CSB is written to the memory cell, the flash memory then adjusts the programming voltage of the memory cell to the level 111, the level 112, the level 113, or the level 114 shown in FIG. 1 according to whether the value of the CSB is the bit 0 or bit 1, wherein the levels 111, 112, 113, and 144 indicate that the stored data content of the memory cell is respectively the bit pattern '11', '01', '00', and '10'. When the MSB is finally written to the memory cell, the flash memory adjusts the programming voltage of the memory cell to the level 101, 102, 103, 104, 105, 106, 107, or 108 shown in FIG. 1 according to whether the value of the MSB is the bit 0 or bit 1, wherein the levels 101, 102, 103, 104, 105, 106, 107, and 108 indicate that the stored data content of the memory cell is respectively the bit pattern '111', '011', '001', '101', '100', '000', '010', and '110'.

When a gap between the programming voltages corresponding to neighboring data patterns increases, the flash memory can easily identify the neighboring data patterns from each other. As shown in FIG. 1, the gaps between the neighboring programming voltage levels 101 and 102, 102 and 103, 103 and 104, 104 and 105, 105 and 106, 106 and 107, and 107 and 108 are roughly equal to each other. The data patterns corresponding to the neighboring programming voltages 101 and 102 are respectively '111' and '011', and the difference bit between the data patterns corresponding to the neighboring programming voltages 101 and 102 is therefore an MSB. The data patterns corresponding to the neighboring programming voltages 102 and 103 are respectively '011' and '001', and the difference bit between the data patterns corresponding to the neighboring programming voltages 102 and 103 is therefore a CSB. The data patterns corresponding to the neighboring programming voltages 103 and 104 are respectively '001' and '101', and the difference bit between the data patterns corresponding to the neighboring programming voltages 103 and 104 is therefore an MSB. Similarly, the difference bit between the data patterns corresponding to the neighboring programming voltages 104 and 105, 105 and 106, 106 and 107, and 107 and 108 are therefore respectively an LSB, an MSB, a CSB, and an MSB. Thus, the difference bit has a higher probability to be an MSB, a medium probability to be a CSB, and a lower probability to be an LSB. When a plurality of memory cells of a flash memory are equally programmed according to the programming voltages 101, 102, 103, 104, 105, 106, 107, and 108, an MSB therefore has the highest amount of error rate occurrences, a CSB therefore has a medium amount of error rate occurrences, and an LSB therefore has the lowest amount of error rate occurrences. Because the MSB is more significant than the CSB and the LSB, if the MSB has a higher amount of error rate occurrences than those of the CSB and the LSB according to the conventional programming voltage shown in FIG. 1, resulting errors would have a greater impact on data written to a flash memory according to the conventional programming voltages. Thus, a data writing method is required to lower the error rate of an MSB of data written to a flash memory, thereby improving the performance of a data storage device.

BRIEF SUMMARY OF THE INVENTION

The invention provides a data writing method. In one embodiment, a data storage device comprises a flash memory, and the flash memory comprises a plurality of memory cells. First, a plurality of programming voltage values for programming most significant bits (MSB) of a plurality of stored data patterns of the memory cells of the flash memory are adjusted to obtain a plurality of adjusted programming voltage values. A target data is then received from a host. The flash memory is then directed to write the target data thereto according to the adjusted programming voltage values.

The invention provides a data storage device. In one embodiment, the data storage device is coupled to a host, and comprises a flash memory and a controller. The flash memory comprises a plurality of memory cells. The controller adjusts a plurality of programming voltage values for programming most significant bits (MSB) of a plurality of stored data patterns of the memory cells of the flash memory to obtain a plurality of adjusted programming voltage values, receiving a target data from the host, and directs the flash memory to write the target data thereto according to the adjusted programming voltage values.

The invention provides a data writing method. In one embodiment, a data storage device comprises a flash memory. First, the flash memory is directed to read a plurality of programming voltage values for data programming. The programming voltage values are then adjusted to obtain a plurality of adjusted programming voltage values according to difference bits between a plurality of stored data patterns corresponding to the programming voltage values. The adjusted programming voltage values are then sent to the flash memory. The flash memory is then directed to perform data programming according to the adjusted programming voltage values, wherein the data programmed according to the adjusted programming voltage values has a lower error bit rate than that of the data programmed according to the programming voltage values.

The invention provides a data storage device. In one embodiment, the data storage device comprises a flash memory and a controller. The flash memory comprises a plurality of memory cells. The controller directs the flash memory to read a plurality of programming voltage values for data programming when the data storage device is enabled, adjusts the programming voltage values to obtain a plurality of adjusted programming voltage values according to difference bits between a plurality of stored data patterns corresponding to the programming voltage values, sends the adjusted programming voltage values to the flash memory, and directs the flash memory to perform data programming according to the adjusted programming voltage values, wherein the data programmed according to the adjusted programming voltage values has a lower error bit rate than that of the data programmed according to the programming voltage values.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 6 is a schematic diagram of a comparison between original programming voltage values and adjusted programming voltage values;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 2:
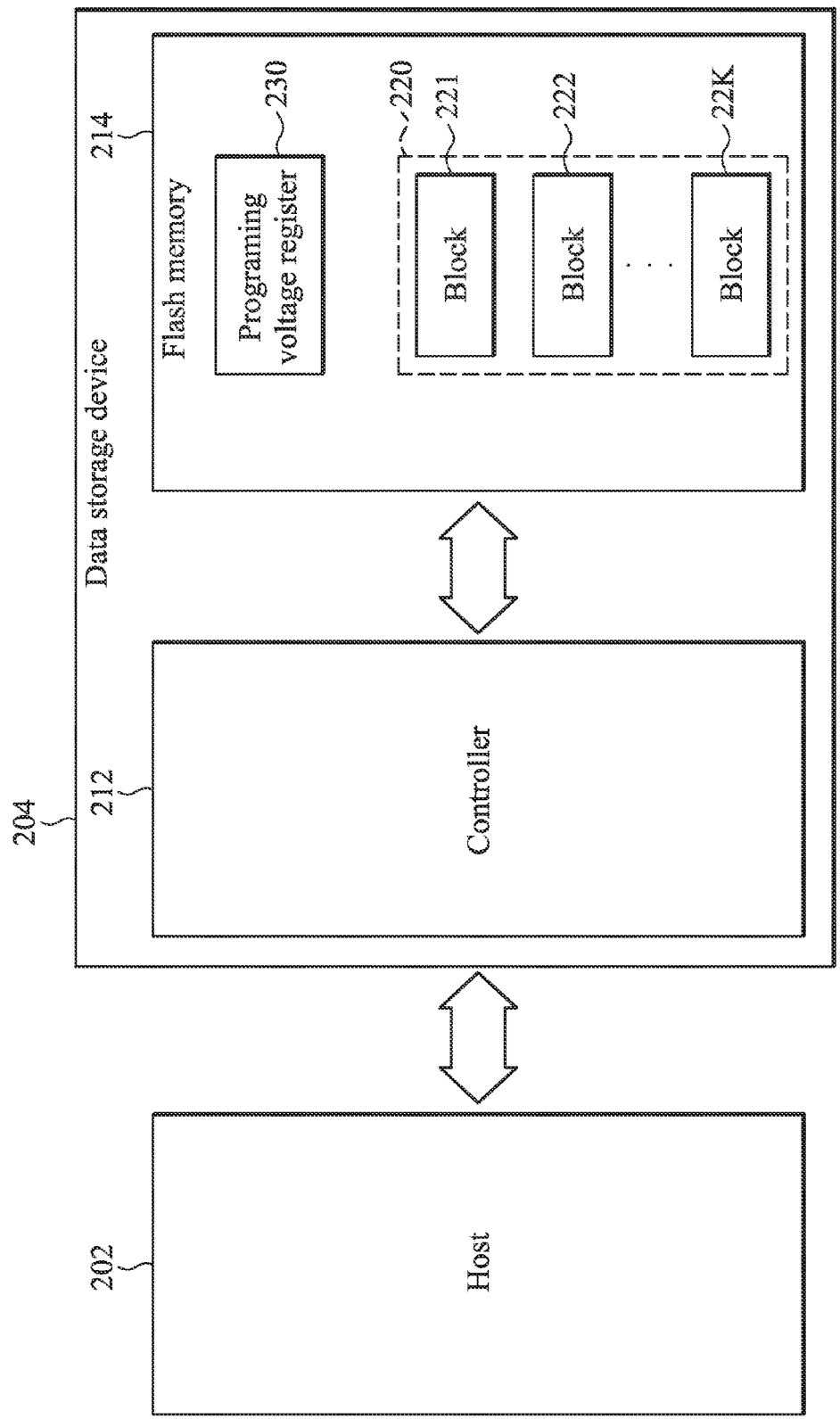
FIG. 2 is a block diagram of a data storage device according to the invention.

Referring to FIG. 2, a block diagram of a data storage device 204 according to the invention is shown. The data storage device 204 is coupled to a host 202. In one embodiment, the data storage device 204 comprises a controller 212 and a flash memory 214. The controller 212 writes data to the flash memory 214 according to commands sent from the host 202, and reads data from the flash memory 214 according to commands sent from the host 202. The flash memory 214 comprises a plurality of blocks 221-22K for data storage. The flash memory 214 may be a multi level cell (MLC) flash memory or a triple level cell (TLC) flash memory. The flash memory 214 further comprises a programming voltage register 230 for storing a plurality of programming voltage values. When the controller 212 sends a write command and data to the flash memory 214, the flash memory 214 writes the data to the flash memory 214 according to the programming voltage values stored in the programming voltage register 230. The controller 212 can therefore adjust the programming voltages used to program data by adjusting the programming voltage values stored in the programming voltage register 230.

Figure 3:
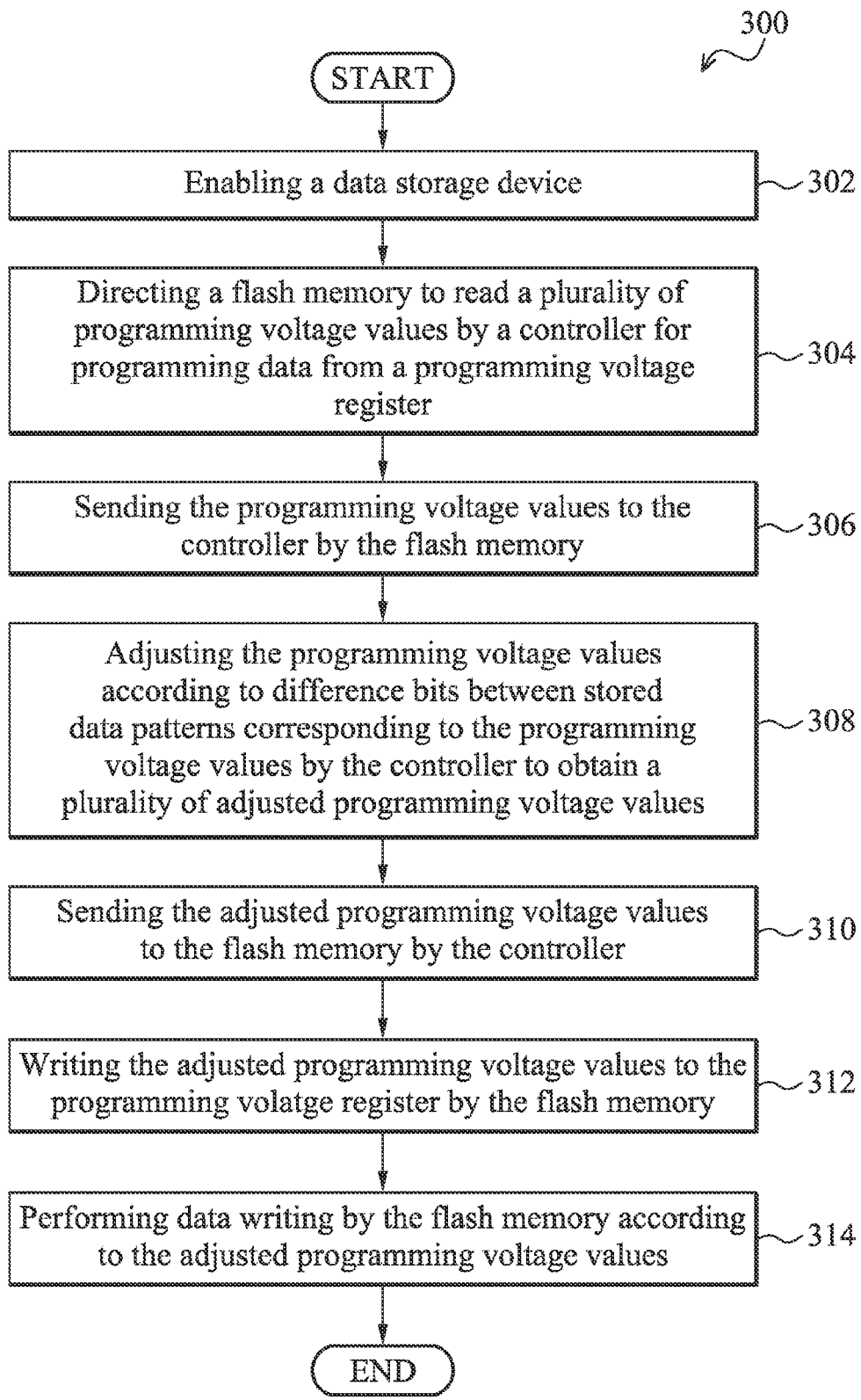
FIG. 3 is a flowchart of a method for writing data to the flash memory according to the invention.

Referring to FIG. 3, a flowchart of a method 300 for writing data to the flash memory 214 according to the invention is shown. First, the data storage device 204 is enabled. The controller 212 then directs the flash memory 214 to read a plurality of programming voltage values for programming data from a programming voltage register 230 (step 304). The flash memory 214 then sends the programming voltage values read from the programming voltage register 230 to the controller 212 (step 306). The controller 212 then adjusts the programming voltage values to obtain a plurality of adjusted programming voltage values (step 308). In one embodiment, the controller 212 adjusts the programming voltage values according to difference bits between stored data patterns corresponding to the programming voltage values. For example, the programming voltage values 102, 103, 104, 105, 106, 107, and 108 shown in FIG. 1 respectively correspond to the data patterns 011, 001, 101, 100, 000, 010, and 110. The controller 212 determines whether a difference bit between two data patterns corresponding to neighboring programming voltage values is MSB, CSB, or LSB as a reference for adjusting the programming voltage values. When the flash memory is an MLC flash memory, the controller 212 determines whether a difference bit between two data patterns corresponding to neighboring programming voltage values is MSB or LSB as a reference for adjusting the programming voltage values. The detailed steps for adjusting the programming voltage values are illustrated with embodiments shown in FIGS. 4 and 8. The controller 212 then sends the adjusted programming voltage values to the flash memory 214 (step 310). The flash memory 214 then writes the adjusted programming voltage values to the programming voltage register 230 (step 312). The flash memory 214 then performs data writing according to the adjusted programming voltage values stored in the programming voltage register 230 (step 314).

Figure 4:
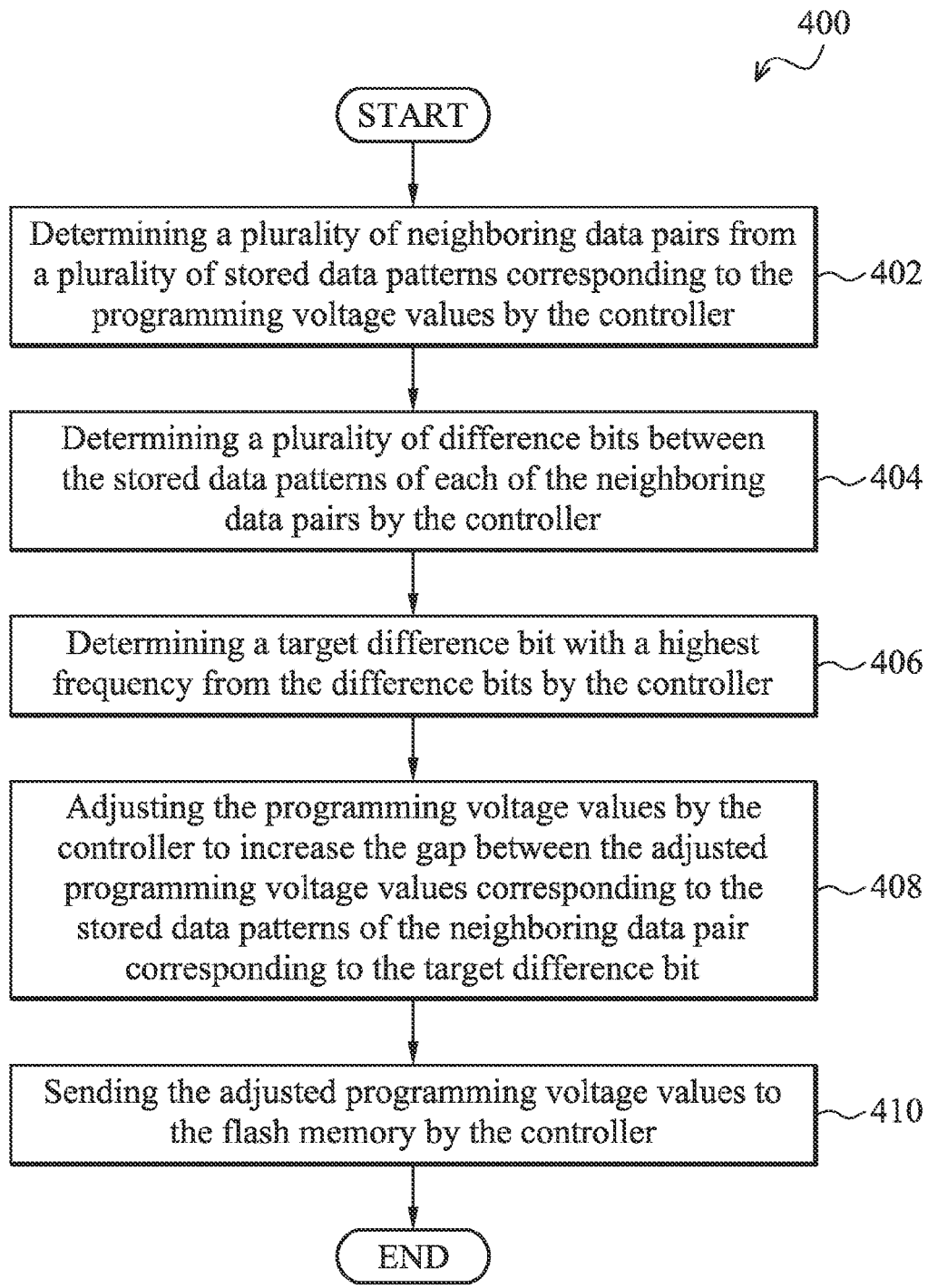
FIG. 4 is a flowchart of a method for adjusting programming voltage values according to the invention.

Referring to FIG. 4, a flowchart of a method 400 for adjusting programming voltage values according to the invention is shown. First, the controller 212 determines a plurality of neighboring data pairs from a plurality of stored data patterns of memory cells of the flash memory 214 (step 402), wherein each of the neighboring data pairs comprises two data patterns respectively corresponding to programming voltage values neighboring to each other. For example, the neighboring data pairs shown in FIG. 1 comprises (A) the data patterns '111' and '011' corresponding to neighboring programming voltage values 101 and 102, (B) the data patterns '011' and '001' corresponding to neighboring programming voltage values 102 and 103, (C) the data patterns '001' and '101' corresponding to neighboring programming voltage values 103 and 104, (D) the data patterns '101' and '100' corresponding to neighboring programming voltage values 104 and 105, (E) the data patterns '100' and '000' corresponding to neighboring programming voltage values 105 and 106, (F) the data patterns '000' and '010' corresponding to neighboring programming voltage values 106 and 107, and (G) the data patterns '010' and '110' corresponding to neighboring programming voltage values 107 and 108.

The controller 212 then determines a plurality of difference bits between the data patterns of each of the neighboring data pairs (step 404). For example, the difference bit between the data patterns 111 and 011 of the neighboring data pair (A) is an MSB, the difference bit between the data patterns 011 and 001 of the neighboring data pair (B) is a CSB, the difference bit between the data patterns 001 and 101 of the neighboring data pair (C) is an MSB, the difference bit between the data patterns 101 and 100 of the neighboring data pair (D) is an LSB, the difference bit between the data patterns 100 and 000 of the neighboring data pair (E) is an MSB, the difference bit between the data patterns 000 and 010 of the neighboring data pair (F) is an CSB, and the difference bit between the data patterns 010 and 110 of the neighboring data pair (G) is an MSB. The controller 212 then determines a target difference bit with a highest occurrence frequency from the difference bits (step 406). For example, the difference bit MSB has an occurrence frequency of 4, the difference bit CSB has an occurrence frequency of 2, and the difference bit LSB has an occurrence frequency of 1. The controller 212 therefore selects the MSB as the target difference bit.

Figure 5:
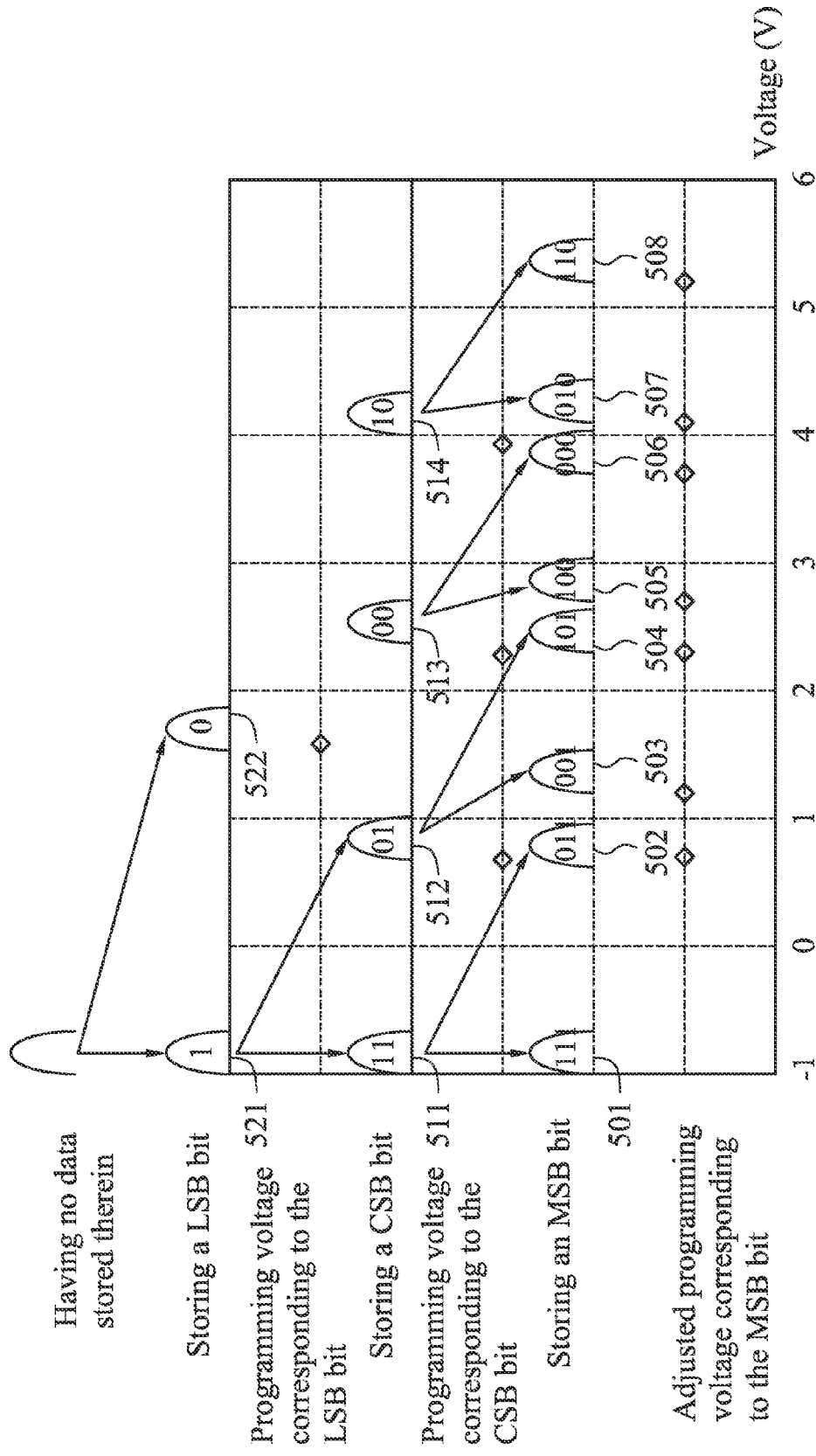
FIG. 5 is a schematic diagram of adjusted programming voltage values generated according to the invention.

The controller 212 then adjusts the programming voltage values to increase the gaps between the adjusted programming voltage values corresponding to the data patterns of the neighboring data pairs corresponding to the target difference bit (step 408). Referring to FIG. 5, a schematic diagram of adjusted programming voltage values generated according to the invention is shown. The controller 212 selects the MSB to be the target difference bit, and the neighboring data pairs corresponding to the target difference bit MSB are (A) the data patterns 111 and 011, (C) the data patterns 001 and 101, (E) the data patterns 100 and 000, and (G) the data patterns 010 and 110. The controller 212 therefore adjusts the programming voltage values to increase the gaps between (A) the data patterns 111 and 011, (C) the data patterns 001 and 101, (E) the data patterns 100 and 000, and (G) the data patterns 010 and 110, as shown in FIG. 5. Finally, the controller 212 sends the adjusted programming voltage values to the flash memory 214 (step 410).

Figure 1:
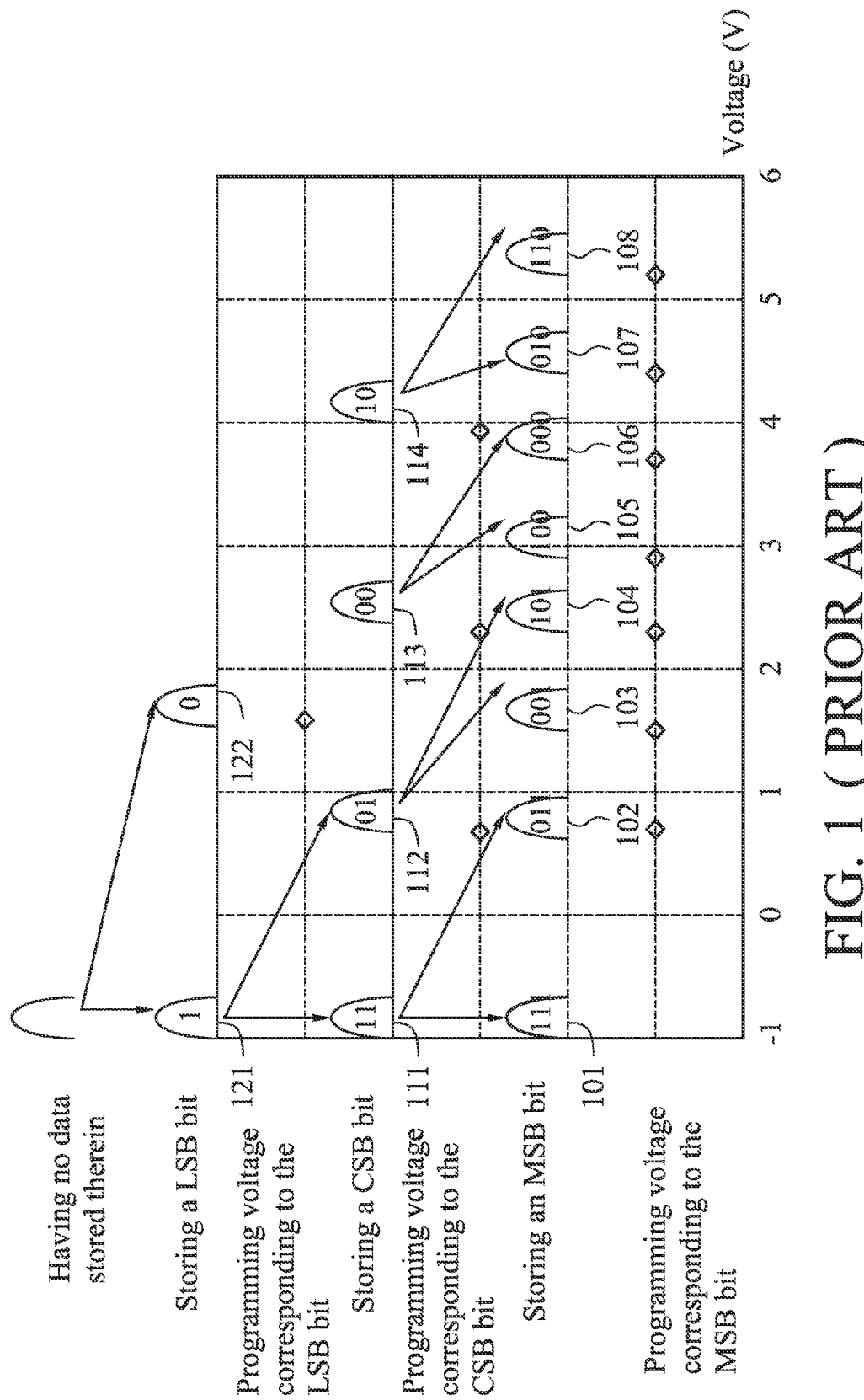
FIG. 1 is a schematic diagram of data programming of a memory cell of a TLC flash memory.

According to the method 400, the controller 212 increases the gaps between the data patterns of the neighboring data pairs corresponding to the target difference bit with the highest occurrence frequency. Because errors of a difference bit having a higher occurrence frequency generate a greater impact to a total error bit rate, when the gaps between the data patterns of the neighboring data pairs corresponding to the MSB with the highest occurrence frequency are increased, although the gaps between the data patterns of the neighboring data pairs corresponding to the CSB and LSB are reduced, the total error bit rate is still reduced. The performance of the data storage device 204 is therefore improved. Referring to FIG. 6, a schematic diagram of a comparison between original programming voltage values and adjusted programming voltage values are shown. As shown in FIG. 1, the original programming voltage values of neighboring data pairs corresponding to the difference bit MSB are (−1V, 0.7V), (1.5V, 2.3V), (2.9V, 3.7V), and (4.4V, 5.2V), and the gaps between the data patterns of the neighboring data pairs are 1.7V, 0.8V, 0.8V, and 0.7V. As shown in FIG. 5, the adjusted programming voltage values of neighboring data pairs corresponding to the difference bit MSB are (−1V, 0.7V), (1.2V, 2.3V), (2.7V, 3.7V), and (4.1V, 5.2V), and the gaps between the data patterns of the neighboring data pairs are 1.7V, 1.1V, 1.0V, and 1.1V. The gaps between the adjusted programming voltage values of neighboring data pairs corresponding to the difference bit MSB is therefore increased in comparison with those between the original programming voltage values.

Figure 7A:
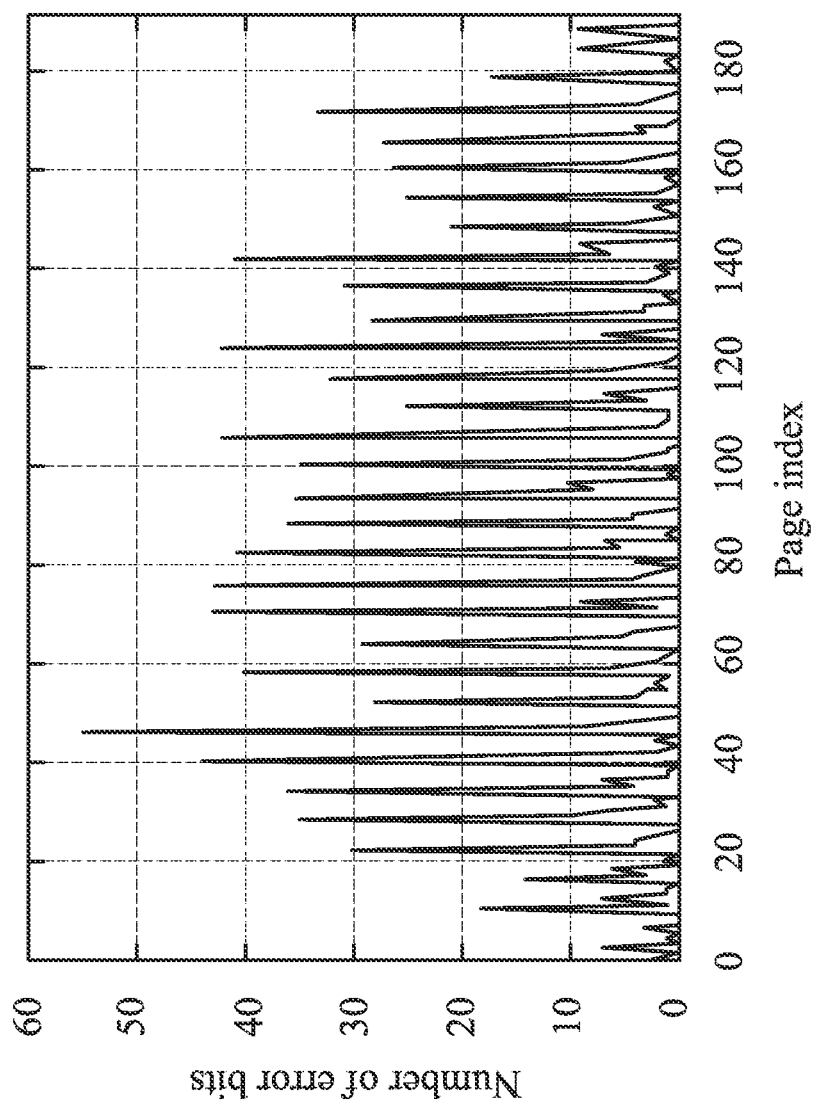
FIG. 7A is a schematic diagram of statistics of error bits with reference to a page index of a flash memory written according to the original programming voltage values of FIG. 1.
Figure 7B:
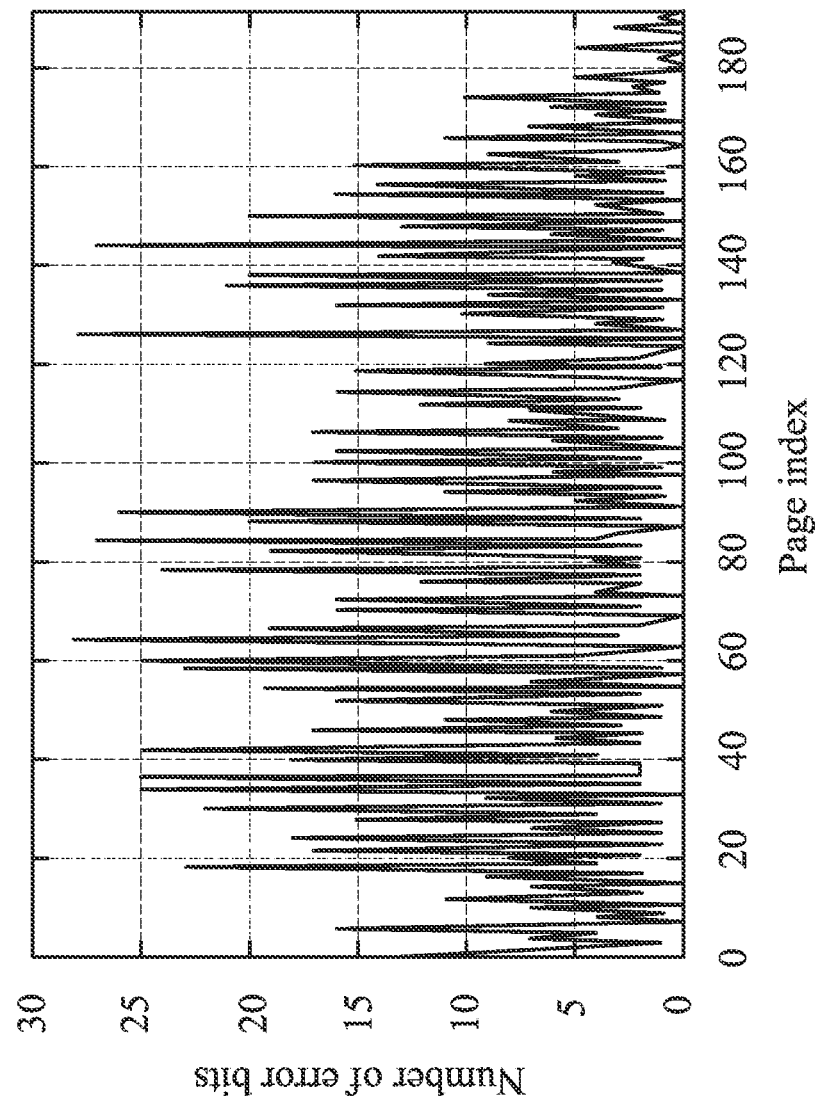
FIG. 7B is a schematic diagram of statistics of error bits with reference to a page index of a flash memory written according to the adjusted programming voltage values of FIG. 5.

Referring to FIG. 7A, a schematic diagram of statistics of error bits with reference to a page index of a flash memory written according to the original programming voltage values of FIG. 1 is shown. Ordinarily, an MSB, a CSB, and an LSB are respectively stored in a very weak page, a weak page, and a strong page of a TLC flash memory. As shown in FIG. 7A, when the flash memory is read, the numbers of the error bits of pages of the flash memory are not equal to each other. Pages with many error bits are usually very weak pages storing MSBs. The error bit number of a very weak page storing MSB is usually greater than 30 bits, resulting in an uncorrectable error by an error correction code. Referring to FIG. 7B, a schematic diagram of statistics of error bits with reference to a page index of a flash memory written according to the adjusted programming voltage values of FIG. 5 is shown. As shown in FIG. 7B, when the flash memory is read, pages with many error bits may be strong pages storing LSBs, weak pages storing CSBs, or very weak pages storing MSBs. The error bit numbers of a very weak page, a weak page, and a strong page are usually less than 30 bits, resulting in correctable errors by an error correction code. Thus, the flash memory 214 performing data programming according to the adjusted programming voltage values has high data correctness and a high performance in comparison with a flash memory performing data programming according to the original programming voltage values.

Figure 8:
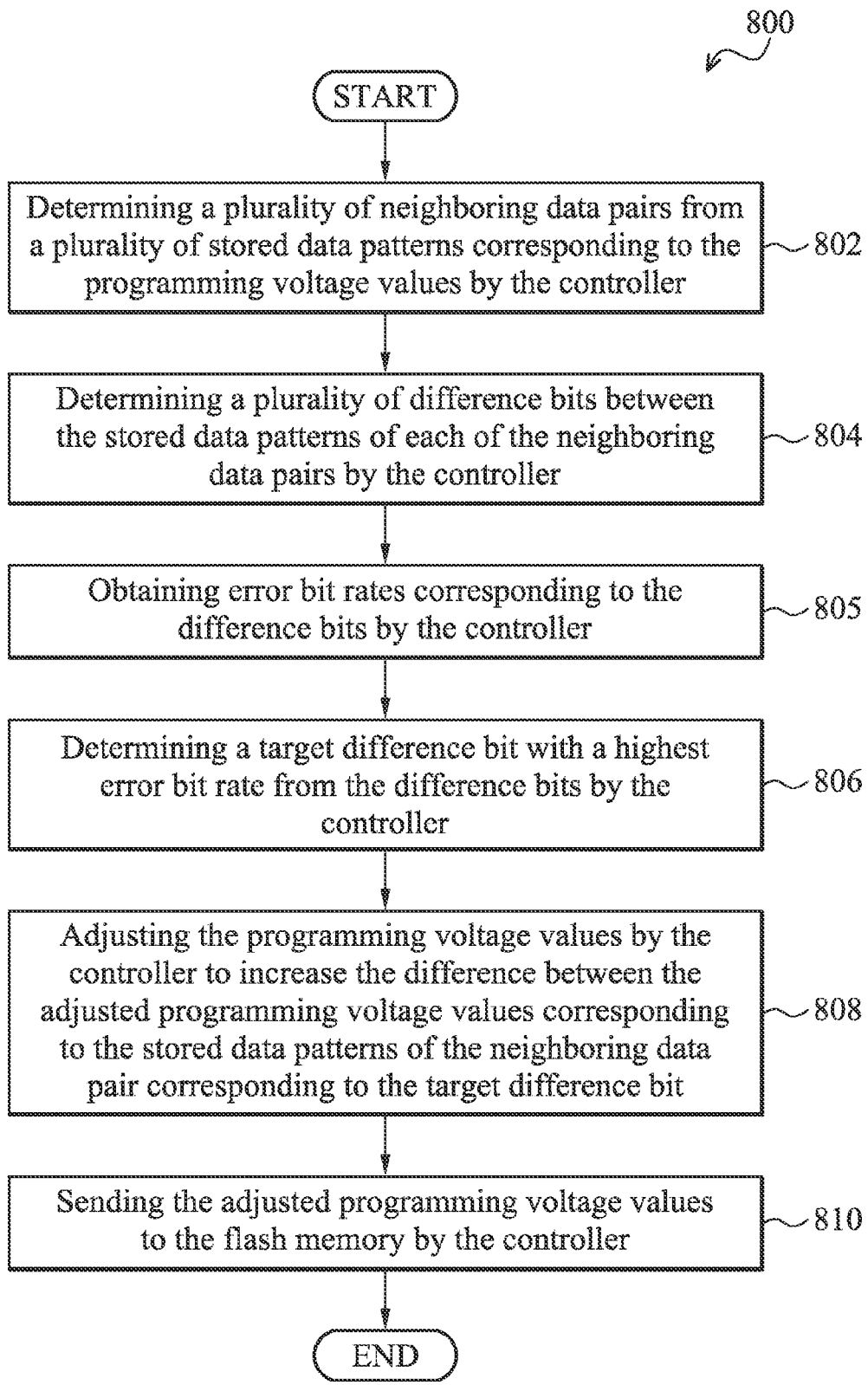
FIG. 8 is a flowchart of another embodiment of a method for adjusting programming voltage values according to the invention.

Referring to FIG. 8, a flowchart of another embodiment of a method 800 for adjusting programming voltage values according to the invention is shown. Except for steps 805 and 806, the steps of the method 800 are almost the same as those of the method 400 shown in FIG. 4. First, the controller 212 determines a plurality of neighboring data pairs from a plurality of stored data patterns of memory cells of the flash memory 214 (step 802), wherein each of the neighboring data pairs comprises two data patterns respectively corresponding to programming voltage values neighboring to each other. The controller 212 then determines a plurality of difference bits between the data patterns of each of the neighboring data pairs (step 804). The controller 212 then obtains error bit rates corresponding to the difference bits (step 805). For example, the difference bits may be MSB, CSB, and LSB, and the error bit rate corresponding to the MSB may be higher than the error bit rates corresponding to the CSB and LSB, as shown in FIG. 7A. The controller 212 then determines a target difference bit with the highest error bit rate from the difference bits (step 806). Thus, the controller 212 determines the target difference bit to be the MSB. The controller 212 then adjusts the programming voltage values to increase the gaps between the adjusted programming voltage values corresponding to the data patterns of the neighboring data pairs corresponding to the target difference bit (step 808). Referring to FIG. 5, the controller 212 selects the MSB to be the target difference bit, and the controller 212 therefore adjusts the programming voltage values to increase the gaps between (A) the data patterns 111 and 011, (C) the data patterns 001 and 101, (E) the data patterns 100 and 000, and (G) the data patterns 010 and 110. Finally, the controller 212 sends the adjusted programming voltage values to the flash memory 214 (step 810).

Figure 9A:
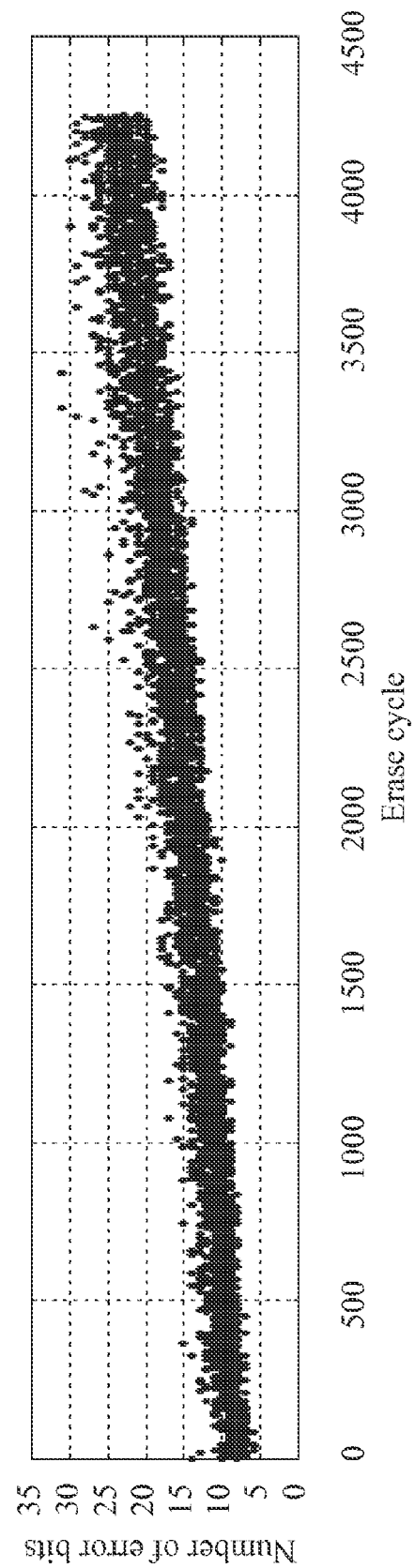
FIG. 9A is a schematic diagram of statistics of error bits of data programmed according to the original programming voltage values of FIG. 1 in reference to erase cycles.
Figure 9B:
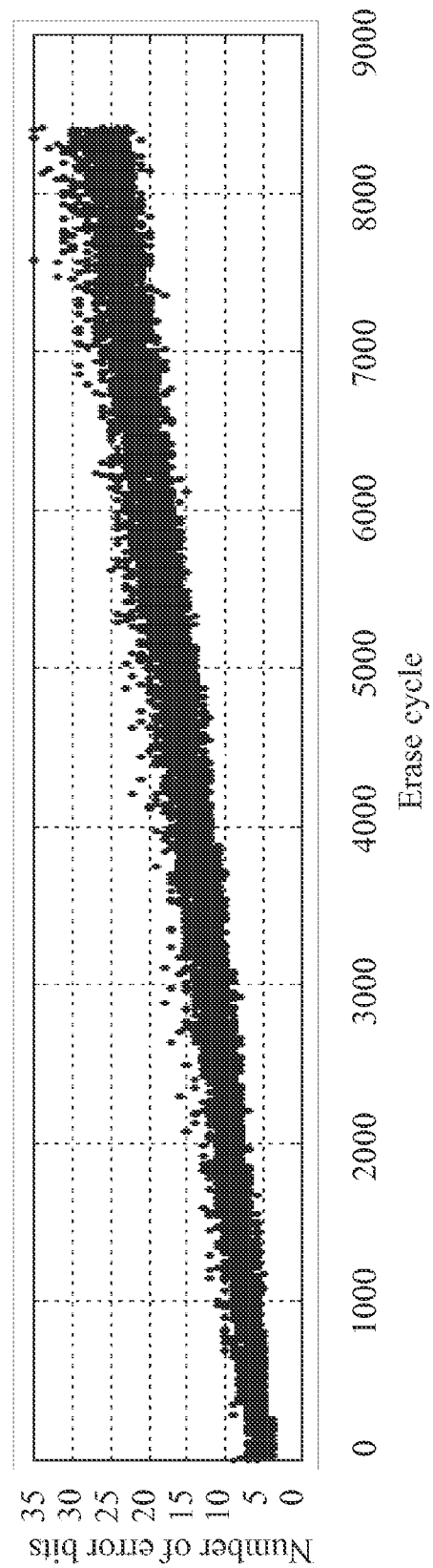
FIG. 9B is a schematic diagram of statistics of error bits of data programmed according to the adjusted programming voltage values of FIG. 5 in reference to erase cycles.

Referring to FIG. 9A, a schematic diagram of statistics of error bits of data programmed according to the original programming voltage values of FIG. 1 in reference to erase cycles. Assume that an error correction code has the capability to correct at most 24 error bits in 1 KB of data. Because the 1 KB data stored in a flash memory with 4000 erase cycles has about 24 error bits, the block endurance of the flash memory is about 4000 erase cycles. Referring to FIG. 9B, a schematic diagram of statistics of error bits of data programmed according to the adjusted programming voltage values of FIG. 5 in reference to erase cycles is shown. Assume that an error correction code has the capability to correct at most 24 error bits in 1 KB of data. Because the 1 KB data stored in a flash memory with 8000 erase cycles has about 24 error bits, the block endurance of the flash memory is about 8000 erase cycles. Thus, the flash memory programmed with the adjusted programming voltage values according to the invention has longer block endurance than that programmed with the original programming voltages.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data writing method, wherein a data storage device comprises a flash memory, and the flash memory comprises a plurality of memory cells, comprising:
    adjusting a plurality of programming voltage values for programming most significant bits (MSB) of a plurality of stored data patterns of the memory cells of the flash memory to obtain a plurality of adjusted programming voltage values;
    receiving a target data from a host; and
    directing the flash memory to write the target data thereto according to the adjusted programming voltage values, wherein the programming voltage values respectively correspond to the stored data patterns of the memory cells and adjusting of the programming voltage values comprises:
        determining a plurality of neighboring data pairs comprising the stored data patterns corresponding to the programming voltage values neighboring to each other;
        determining a plurality of difference bits between the stored data patterns of the neighboring data pairs;
        determining a plurality of target neighboring data pairs with difference bits corresponding to the most significant bits from the neighboring data pairs; and
        adjusting the programming voltage values to increase the gaps between the adjusted programming voltage values corresponding to the stored data patterns of the target neighboring data pairs.

2. The data writing method as claimed in claim 1, wherein adjusting of the programming voltage values comprises:
    reading the programming voltage values from a register of the flash memory;
    sending the adjusted programming voltage values to the flash memory; and
    storing the adjusted programming voltage values in the register.

3. The data writing method as claimed in claim 1, wherein the flash memory is a triple level cell (TLC) flash memory, and each of the stored data patterns comprise a least significant bit (LSB), a center significant bit (CSB), and a most significant bit (MSB).

4. A data storage device, coupled to a host, comprising:
    a flash memory, comprising a plurality of memory cells; and
    a controller, adjusting a plurality of programming voltage values for programming most significant bits (MSB) of a plurality of stored data patterns of the memory cells of the flash memory to obtain a plurality of adjusted programming voltage values, receiving a target data from the host, and directing the flash memory to write the target data thereto according to the adjusted programming voltage values, wherein the programming voltage values respectively correspond to the stored data patterns of the memory cells and when the controller adjusts the programming voltage values, the controller determines a plurality of neighboring data pairs comprising the stored data patterns corresponding to the programming voltage values neighboring to each other, determines a plurality of difference bits between the stored data patterns of the neighboring data pairs, determines a plurality of target neighboring data pairs with the difference bits corresponding to the most significant bits from the neighboring data pairs, and adjusts the programming voltage values to increase the gaps between the adjusted programming voltage values corresponding to the stored data patterns of the target neighboring data pairs.

5. The data storage device as claimed in claim 4, wherein the controller reads the programming voltage values from a register of the flash memory before the controller adjusts the programming voltage values, and after the controller adjusts the programming voltage values, the controller sends the adjusted programming voltage values to the flash memory, and the flash memory stores the adjusted programming voltage values in the register.

6. The data storage device as claimed in claim 4, wherein the flash memory is a triple level cell (TLC) flash memory, and each of the stored data patterns comprise a least significant bit (LSB), a center significant bit (CSB), and a most significant bit (MSB).

7. A data writing method, wherein a data storage device comprises a flash memory, comprising:
    when the data storage device is enabled, directing the flash memory to read a plurality of programming voltage values for data programming;
    adjusting the programming voltage values to obtain a plurality of adjusted programming voltage values according to difference bits between a plurality of stored data patterns corresponding to the programming voltage values;

sending the adjusted programming voltage values to the flash memory; and directing the flash memory to perform data programming according to the adjusted programming voltage values, wherein the data programmed according to the adjusted programming voltage values has a lower error bit rate than that of the data programmed according to the programming voltage values and adjusting of the programming voltage values comprises:

determining a plurality of neighboring data pairs from the stored data patterns, wherein the programming voltage values corresponding to the stored data patterns of the neighboring data pairs neighbor to each other;

determining a plurality of difference bits between the stored data patterns of the neighboring data pairs;

selecting a target difference bit with a highest occurrence frequency or a highest error bit rate from the difference bits; and adjusting the programming voltage values to increase the gaps between the adjusted programming voltage values corresponding to the stored data patterns corresponding to the target difference bit.

8. The data writing method as claimed in claim 7, wherein the target difference bit is the most significant bit, and the adjusted programming voltage values are for programming the most significant bit.

9. The data writing method as claimed in claim 7, wherein the flash memory is a triple level cell (TLC) flash memory, and each of the stored data patterns comprise a least significant bit (LSB), a center significant bit (CSB), and a most significant bit (MSB).

10. The data writing method as claimed in claim 7, wherein the flash memory is a multi level cell (MLC) flash memory, and each of the stored data patterns comprise a least significant bit (LSB and a most significant bit (MSB).

11. A data storage device, comprising:
a flash memory, comprising a plurality of memory cells; and
a controller, when the data storage device is enabled, directing the flash memory to read a plurality of programming voltage values for data programming, adjusting the programming voltage values to obtain a plurality of adjusted programming voltage values according to difference bits between a plurality of stored data patterns corresponding to the programming voltage values, sending the adjusted programming voltage values to the flash memory, and directing the flash memory to perform data programming according to the adjusted programming voltage values, wherein the data programmed according to the adjusted programming voltage values has a lower error bit rate than that of the data programmed according to the programming voltage values and when the controller adjusts the programming voltage values, the controller determines a plurality of neighboring data pairs from the stored data patterns, determines a plurality of difference bits between the stored data patterns of the neighboring data pairs, selects a target difference bit with a highest occurrence frequency or a highest error bit rate from the difference bits, and adjusts the programming voltage values to increase the gaps between the adjusted programming voltage values corresponding to the stored data patterns corresponding to the target difference bit, wherein the programming voltage values corresponding to the stored data patterns of the neighboring data pairs neighbor to each other.

12. The data storage device as claimed in claim 11, wherein the target difference bit is the most significant bit, and the adjusted programming voltage values are for programming the most significant bit.

13. The data storage device as claimed in claim 11, wherein the flash memory is a triple level cell (TLC) flash memory, and each of the stored data patterns comprise a least significant bit (LSB), a center significant bit (CSB), and a most significant bit (MSB).

14. The data storage device as claimed in claim 11, wherein the flash memory is a multi level cell (MLC) flash memory, and each of the stored data patterns comprise a least significant bit (LSB) and a most significant bit (MSB).

* * * * *